(12) United States Patent
Linares et al.

(10) Patent No.: US 7,829,377 B2
(45) Date of Patent: Nov. 9, 2010

(54) DIAMOND MEDICAL DEVICES

(75) Inventors: Robert C. Linares, Sherborn, MA (US); Patrick J. Doering, Holliston, MA (US); Bryant Linares, Sherborn, MA (US); Alfred R. Genis, East Douglas, MA (US); William W. Dromeshauser, Norwell, MA (US); Michael Murray, Mountain View, CA (US); Alicia E. Novak, Denver, CO (US); John M. Abrahams, Scarsdale, NY (US)

(73) Assignee: Apollo Diamond, Inc, Framingham, MA (US)

( * ) Notice: Subject to any disclaimer, the term of this patent is extended or adjusted under 35 U.S.C. 154(b) by 879 days.

(21) Appl. No.: 11/329,959

(22) Filed: Jan. 11, 2006

(65) Prior Publication Data
US 2006/0234419 A1  Oct. 19, 2006

Related U.S. Application Data

(60) Provisional application No. 60/643,390, filed on Jan. 11, 2005.

(51) Int. Cl.
*H01L 21/00* (2006.01)
(52) U.S. Cl. .................. 438/105; 438/514; 438/555; 438/549
(58) Field of Classification Search ............. 438/514, 438/549, 555, 567, 680, 761, 763, 798, 946, 438/FOR. 389, 105
See application file for complete search history.

(56) References Cited

U.S. PATENT DOCUMENTS

| | | |
|---|---|---|
| 5,587,210 A | 12/1996 | Marchywka et al. |
| 6,582,513 B1 | 6/2003 | Linares et al. |
| 6,613,601 B1 * | 9/2003 | Krauss et al. ........... 438/52 |
| 7,122,837 B2 | 10/2006 | Linares et al. |

(Continued)

FOREIGN PATENT DOCUMENTS

CN  1441860 A  9/2003

(Continued)

OTHER PUBLICATIONS 06717944.0, "European Application No. 06717944.0 Office Action Mailed Mar. 13, 2009", 6 pgs.

(Continued)

*Primary Examiner*—N Drew Richards
*Assistant Examiner*—Mamadou Diallo
(74) *Attorney, Agent, or Firm*—Schwegman, Lundberg & Woessner, P.A.

(57) ABSTRACT

Masked and controlled ion implants, coupled with annealing or etching are used in CVD formed single crystal diamond to create structures for both optical applications, nanoelectromechanical device formation, and medical device formation. Ion implantation is employed to deliver one or more atomic species into and beneath the diamond growth surface in order to form an implanted layer with a peak concentration of atoms at a predetermined depth beneath the diamond growth surface. The composition is heated in a non-oxidizing environment under suitable conditions to cause separation of the diamond proximate the implanted layer. Further ion implants may be used in released structures to straighten or curve them as desired. Boron doping may also be utilized to create conductive diamond structures.

16 Claims, 8 Drawing Sheets

U.S. PATENT DOCUMENTS

| | | | |
|---|---|---|---|
| 2003/0155851 A1* | 8/2003 | Pehrsson et al. | 313/309 |
| 2004/0021408 A1* | 2/2004 | Wort et al. | 313/346 R |
| 2004/0221795 A1 | 11/2004 | Scarsbrook et al. | |
| 2005/0031785 A1* | 2/2005 | Carlisle et al. | 427/249.8 |
| 2006/0157713 A1 | 7/2006 | Linares et al. | |
| 2009/0214169 A1 | 8/2009 | Linares et al. | |

FOREIGN PATENT DOCUMENTS

| | | |
|---|---|---|
| EP | 0745707 A1 | 12/1996 |
| EP | 1119045 A2 | 7/2001 |
| JP | 2-385 A | 5/1990 |
| WO | WO-01/96633 A1 | 12/2001 |
| WO | WO-2006/076354 A2 | 7/2006 |
| WO | WO-2006/076354 A3 | 7/2006 |
| WO | WO-2007/009037 A1 | 1/2007 |

OTHER PUBLICATIONS

Application Serial No. PCT/US2006/000808, International Search Report and Written Opinion mailed Aug. 25, 2006, 19 pgs.

Application Serial No. PCT/US2006/000808, Invitation to Pay Additional Fees mailed May 23, 2006, 9 pgs.

Biersack, J. P., et al., "A Monte Carlo Computer Program for the Transport of Energetic Ions in Amorphous Targets," *Nucl. Instr. Meth.*, vol. 251 (1980), 174 pgs.

Drabenstedt, A., et al., "Low-temperature Microscopy and Spectroscopy on single Defect Centers in Diamond," *Physical Review B*, vol. 60, No. 16 (Oct. 15, 1999), 6 pgs.

Gruber, A., et al., "Scanning Confocal Optical Microscopy and Magnetic Resonance on Single Defect Centers," *Science*, vol. 276 (Jun. 1999), 2012-2014.

Hemmer, P., et al., "Raman excited spin coherences in N-V diamond," *Lasers and Electro-Optics Conference* (2001), 374-375.

Hoshikawa, K., et al., "Production of a bridge structure using diamond film." *Thin Solid Films*, 281/282(1/2) (Aug. 1, 1996), 545-547.

Hunn, J. D., "Ion Beam and Laser-Assisted Micromachining of Single-Crystal Diamond," *Solid State Technology*, 37(12) (Dec. 1, 1994), 57-60.

Kilinn, S., et al., "Model Systems and photo-kinetics of single N-V defect centers in diamond," *Quantum Electronics Conference* (2000), 1 pg.

Wrachtrup, J., "Optical spectroscopy and control of single defect centers in solids," *Postconference Digest of Quantum Electronics and laser science* (2003), 2 pgs.

"U.S. Appl. No. 11/178,623, Notice of Allowance mailed Apr. 10, 2006", 7 pgs.

"U.S. Appl. No. 11/178,623, Supplemental Notice of Allowability mailed May 23, 2006", 3 pgs.

"Chinese Application No. 200680007879.6, Office Action Mailed Feb. 6, 2009", (English Translation), 11 pgs.

"International Application Serial No. PCT/US2006/027196, International Search Report mailed Oct. 24, 2006", 4 pgs.

"International Application Serial No. PCT/US2006/027196, Written Opinion mailed Oct. 24, 2006", 7 pgs.

Charnock, F. T, et al., "Combined Optical and Microwave Approach for Performing Quantum Spin Operations on the Nitrogen-Vacancy Center in Diamond", *Physical Review B (Condensed Matter and Materials Physics)*, 64(4), (2001), 041201-1-041201-4.

Kennedy, T. A, et al., "Single-Qubit Operations with the Nitrogen-Vacancy Center in Diamond", *Physica Status Solidi B*, 233(3), (2002), 416-426.

Kennedy, T. A., et al., "Long coherence times at 300 K for nitrogen-vacancy center spins in diamond grown by chemical vapor deposition", *Applied Physics Letters*, 83(20), (2003), 4190-4192.

Rabeau, J. R, et al., "Diamond Chemical-Vapor Deposition on Optical Fibers for Fluorescence Waveguiding", *Applied Physics Letters*, 86(13), (2005), 134104-1-134104-3.

"Chinese Application Serial No. 200680007879.6, Response filed Aug. 20, 2009 to First Office Action mailed Feb. 6, 2009", (w/. English Translation of Amended Claims), 10 pgs.

"European Application Serial No. 06717944.0, Response filed Aug. 26, 2009 to Communication mailed Mar. 13, 2009", 17 pgs.

* cited by examiner

DIAMOND MEDICAL DEVICES

RELATED APPLICATION

This application claims the benefit of U.S. Provisional Application Ser. No. 60/643,390 filed Jan. 11, 2005, titled "Diamond Medical Devices," which is incorporated herein by reference. This application also claims priority to U.S. patent application Ser. No. 11/178,623 filed Jul. 11, 2005, titled "Structures Formed in Diamond," which is incorporated herein by reference. This application also claims priority to U.S. patent application Ser. No. 11/056,338 filed Feb. 11, 2005, titled "Diamond Structure Separation," which is incorporated herein by reference.

BACKGROUND

Diamond appears to be highly biocompatible with living tissue. Currently, diamond does not appear to exhibit carcinogenetic or toxicity for in situ applications, and it appears to be biologically inert in bulk form. Diamond may be synthesized in a variety of ways. However, it is a difficult material to work with, and new techniques may be required for forming structures for handling biological materials.

Modern semiconductors are typically based on silicon, with various elements doped to change their electrical properties. For example, doping silicon with phosphorous creates a surplus of electrons resulting in n-type semiconductor material due to the fifth valence electron not present in silicon, which has only four valence electrons. Similarly, doping silicon with boron creates p-type silicon having a surplus of "holes", or an absence of electrons, because boron has only three valence electrons which is one fewer than silicon.

When n-type and p-type silicon are in contact with one another, electricity flows in one direction across the junction more easily than in the other direction. More complex configurations of n-type and p-type material can be assembled to form various types of transistors, integrated circuits, and other such devices.

But, the performance of certain semiconductor devices is limited by the properties inherent in the semiconductor materials used. For example, a processor's speed is limited by the amount of power that can be dissipated in the transistors and other devices that make up the processor integrated circuit, which can literally melt if operated too fast. Reduction in size is also limited, because as more transistors dissipating a certain amount of power are packed into a smaller area, the amount of heat dissipated in a certain area increases. Even simple devices such as diodes used in high-frequency, high-power applications suffer from power limitations, since the physical size of an individual transistor or diode is typically very small.

Semiconductor devices enabling greater power dissipation and higher semiconductor device densities are desirable to provide higher performance, smaller electrical devices.

SUMMARY

Masked and controlled ion implants, coupled with annealing or etching are used in CVD formed single crystal diamond to create structures for both optical applications, nanoelectromechanical device formation, and medical device formation. Ion implantation is employed to deliver one or more atomic species into and beneath the diamond growth surface in order to form an implanted layer with a peak concentration of atoms at a predetermined depth beneath the diamond growth surface. The composition is heated in a non-oxidizing environment under suitable conditions to cause separation of the diamond proximate the implanted layer. Further ion implants may be used in released structures to straighten or curve them as desired. Boron doping may also be utilized to create conductive diamond structures.

In one embodiment, a nanochannel is formed by implanting ions in a diamond at a point where the nanochannel is desired. Masks may be used to control a width and length of the implant, and selected implant power levels can be utilized to control the depth of the implant. Heating the diamond causes a separation to occur at or about the implant. Such separation may be used as a nanochannel for conveying fluids, or as a low refractive index portion of a waveguide.

Further implants may be sized and shaped to form an etalon, optical filter, or optical deflector when heated to cause separation. An approximately 500 nm circular shape is used in one embodiment. Using a progression of masks and implant depths can provide for formation of many different mechanical structures, such as those that may be formed in silicon. Further layers of synthetic diamond of one or more diamond layers may be grown following the implants.

In still further embodiments, device formed of materials other than diamond, such as silicon or germanium based devices are coated with CVD diamond, providing a highly biocompatible device protected from oxidation.

DETAILED DESCRIPTION

Figure 1:
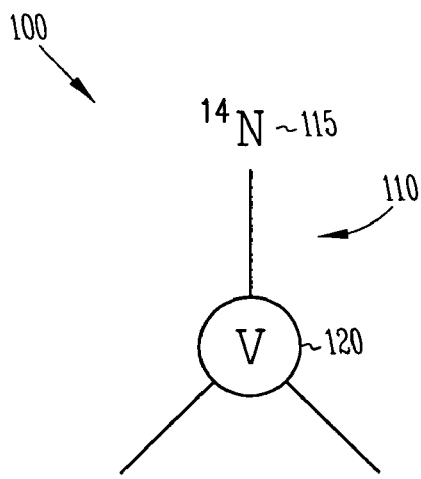
FIG. 1 is a block representation of a diamond having a Nv-center according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

A first section of the application describes the ability to create N-V centers in single crystal diamond in a controlled manner. Various ion implant processes are described that allow the creation of structures in single crystal diamond. These processes may then be used to create structures in other contexts, as described in a medical devices section. Further description is provided with respect to doping of single crystal diamond to obtain various semiconductor and conducting properties, which may be used in conjunction with nano and micromechanical devices formed in the diamond.

N-V centers in diamond can be created in a controlled manner. In one embodiment, a single crystal diamond is formed using a CVD process with nitrogen included in the growth process, and then annealed to remove N-V centers. A thin layer of single crystal diamond is then formed with a controlled number of N-V centers. The N-V centers form Qubits for use in electronic circuits.

Qubit devices are formed in diamond having highly controlled purity. A highly controlled number of N-V centers can be produced, and the N-V centers are isolated from each other and from other elements having a magnetic spin such as N-V°, Ns and 13C (carbon 13). In one embodiment, single, isolated N-V centers are used to obtain information from individual atoms rather than from clusters. In further embodiments, it may be desirable to have N-V adjacent to 13C. In still further embodiments, the diamond has high crystal perfection since imperfections lead to shorter spin lifetimes and nitrogen tends to segregate at imperfections such as dislocations giving the effect of a higher concentration and the attendant interaction between adjacent spins and reduction of lifetime.

In one embodiment, light is able to enter and leave the diamond host material in a controlled manner. When a Qubit emits light, the light will be emitted over a spherical surface and the light intensity at any point will be very low and difficult to detect. The Qubit is contained within an optical waveguide which traps and directs the light in a minimum number of directions. Diamond is ideal for such a waveguide since it has a very high index of refraction (2.4 in the visible range). A thin layer of diamond in contact with air or vacuum on both sides provides such a waveguide. Diamond has a significantly higher index of refraction than air, such that a light beam propagating down the waveguide is internally reflected by the walls of the diamond waveguide and be confined to the diamond waveguide. With the Qubit within the diamond waveguide, most of the light emitted by the Qubit will be transmitted down the waveguide and be readily collected and detected. Other forms of transmission may also be utilized, such as by means of a plasma waveguide or slot waveguide. In still further embodiments, small metal wires are utilized to draw light from a Qubit. The light propagates on the outside of the wire within a diamond cladding.

One method for building a Qubit device involves growing single crystals by the HPHT method, incorporating a desired amount of nitrogen atoms which will all be Ns, irradiating the diamond to generate carbon vacancies and annealing to diffuse the carbon vacancies to the nitrogen atoms thereby causing N-V centers. This method may result in irradiation causing a significant level of crystal damage which decreases Qubit lifetime.

Another method of producing N-V centers in HPHT diamond involves growing the diamond with a titanium or aluminum getter to remove all of the nitrogen from the diamond and put nitrogen into the diamond later by ion implantation into selected spots. This method may not lend itself well to production of large size diamond wafers which would be suitable for device production.

FIG. 1 is a block representation of a diamond crystal lattice 100 having an N-V$^-$ center 110 according to an example embodiment. Center 110 is also representative of N-V centers with different charge states. As described above, an N-V$^-$ center 110 is nitrogen 115 in a substitutional site in diamond which is adjacent to a carbon vacancy 120. In FIG. 1, the N-V$^-$ center 110 is isolated from other N-V centers such that spins of other centers and other structures do not interfere with the isolated N-V$^-$ center, thus forming a Qubit.

The N-V$^-$ center 110 in diamond has several attributes which make it desirable for Qubit based devices. It is easily pumped using low power microwaves. It is also easily detected (emission at 675 nanometers wavelength). Such N-V$^-$ centers in diamond have long lifetimes (60 to 500 microseconds) and room temperature operation. Diamond also has a high degree of optical transparency and a high optical index of refraction, enabling construction of optical waveguides and other optical structures.

One method of producing N-V centers involves the use of CVD grown diamond. CVD diamond can be grown in large sizes with highly controlled purity as seen in (see U.S. Pat. No. 6,582,513) and with layers of controlled purity, thickness and properties. CVD diamond may be grown with high or low nitrogen concentrations, thin layers with or without 13C. N-V center formation may be controlled by several means.

CVD diamond grows under conditions where N-V$^-$, N-V° and Ns are all stable. Furthermore the ratios of these states can be varied by the growth conditions, the concentration and by heat treatment after growth. Moreover, it is possible to grow a substrate which is essentially free of all states of nitrogen and then grow a film of diamond which has only the desired level of nitrogen. Since the number of atoms of nitrogen in the film will be a function of concentration and thickness, N-V$^-$ centers may be isolated from all other centers. In other words, given a known concentration of N-V centers that will be formed in a given volume of CVD grown diamond, making the diamond layer very thin assures that very few N-V centers are formed, and are thus isolated from each other.

In further embodiments, a carbon source for the CVD growth of the film has a desired level of 13C carbon by either depleting the 13C in the source gas or by enriching the 13C level. In one embodiment, a separation of about 2 microns is desired for non interaction between a N-V$^-$ and other N centers. This is estimated at about 10 ppb which has already been demonstrated. Additionally, a diamond layer of only nominal purity may be grown and then annealed at high temperature to convert all N-V centers to Ns. This removes any extraneous signal from stray N-V atoms since Ns does not have an optical signal at the N-V$^-$ wavelength. It can also be appreciated that a number of layers can be grown which are alternating between high purity and specific numbers of N-V centers to obtain a three dimensional structure having isolated N-V in adjacent layers. Each layer may be designed as a waveguide as described below, and have multiple and separated functions.

In each of the above embodiments, N-V centers may be randomly placed in the volume of the crystal, but can be readily found and marked for detection during the operation of the device.

In further embodiments, different types of diamond may be used, such as natural, mined diamonds, high pressure, high temperature manufactured diamonds, CVD formed diamonds or others. Such diamond may then be annealed to destroy N-V centers, followed by implantation to create desired densities of N-V centers, and further implantation to form waveguides.

An alternate method utilizes very pure bulk crystal with or without the film of desired isotopic purity, heat treat to destroy all residual N-V centers and then implant single, isolated, N-V centers at desired locations. A capping layer of highly pure diamond may then be grown on the layer.

Waveguides may be formed proximate the N-V centers and optically coupled to them. In one embodiment, Hydrogen is implanted in the diamond in stripes, followed by heat treating the structure to create a cavity which separates the strip of diamond from the underlying diamond. The strip of diamond is essentially surrounded by air and is used as an optical waveguide for bringing signals into and out of the diamond structure. It provides a highly isolated optical signal in and out and allows for multiple channels for optical in and out on a single diamond chip. Furthermore multiple functions may be provided, such as amplifiers, storage and computing all on one optical chip. Implant of multiple energies may provide multiple strips with separation layers from each other, in depth, allowing production of three dimensional, optically isolated Qubit structures. Such structures may significantly decrease the size of such devices since much of the volume could be utilized. Slot waveguides may also be formed.

It should also be noted that in the case of separated channel waveguides, that the waveguide can be altered in its properties by causing the waveguide to rise or fall in spots or along its length by application of heat or voltage cycling. This is in essence a fully attached device. This can be used as a switch to turn off or on the light or as a switch to move the light to another channel. In one embodiment, Qubits, optical switching and MEMS technology are combined into the same chip with its attendant applications. The use of masked or otherwise patterned implantation and lift-off technology permits the building of a range of waveguide structures such as sheets, plates, wires, disks and multiples of these shapes all with the possibility of modulation and switching as in optoelectronic and MEMS devices. It is also possible to build either normally open or normally closed switches and mixers by design of the proximity and shape of such waveguides.

Diamond Qubits may also be formed in conjunction with other semiconductors. Diamond may be bonded to other semiconductors such as silicon, gallium arsenide, gallium nitride, silicon carbide or III-IV alloys. The semiconductors can also be grown onto the diamond substrate. The attachment of diamond to other semiconductors will permit optoelectronic devices such as lasers, detectors and associated circuitry to be directly integrated with the diamond QBIT to provide input and output to and from conventional sources, devices and systems. This will provide the basis for optical busses for higher speed interconnects in conventional computers and future QBIT based computers. In fact a whole new family of integrated Qubit-Semiconductor devices (QSD) will be possible by combining the technologies and methods discussed.

Figure 2:
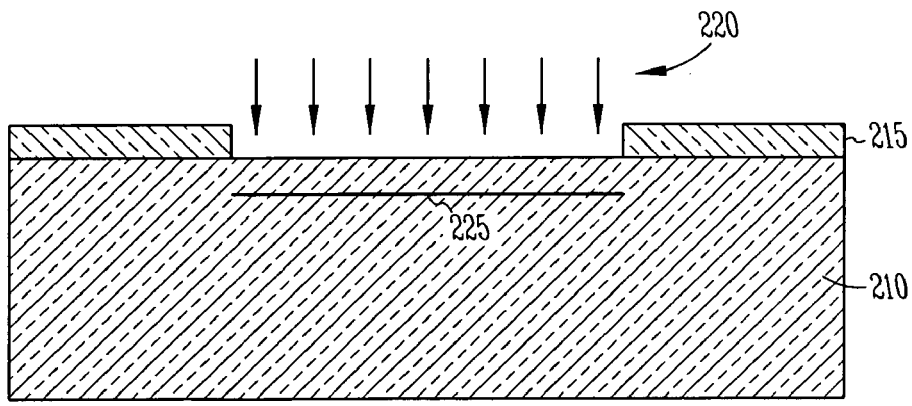
FIG. 2 is a side view cross sectional representation of a diamond illustrating a masked ion implant process according to an example embodiment.

FIG. 2 is a side view cross sectional representation of a diamond illustrating a masked ion implant process according to an example embodiment in order to form a waveguide in proximity to a Qubit formed as above. In one embodiment, the Qubit is an isolated Qubit, and the location of the Qubit is used as a guide for forming the waveguide, such that the Qubit is located within the waveguide. In further embodiments, the Qubit is formed in an already formed waveguide.

Figure 3:
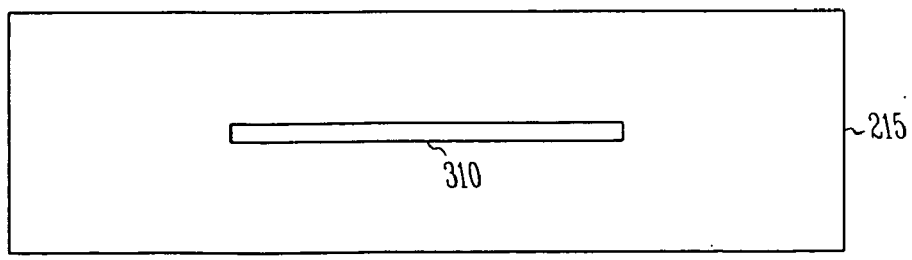
FIG. 3 is a top view of the diamond of FIG. 2, illustrating the mask for ion implantation according to an example embodiment.

A diamond substrate 210 is covered with a mask 215 in one embodiment. The mask 215 is formed of a material sufficient to screen out ions 220 being implanted at desired energy levels. The mask may take many different shapes, but one such shape is shown in top view FIG. 3 at 310. In this embodiment, the mask is in the shape of a long, thin rectangle, resulting in a long thin implant 225 at a desired depth.

Figure 4:
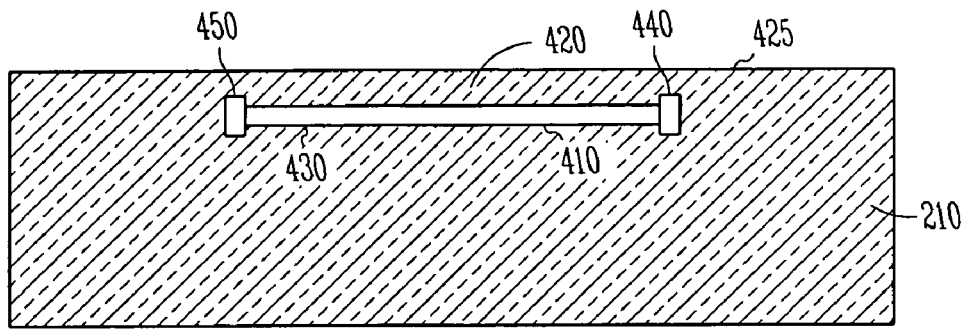
FIG. 4 is a side view cross sectional representation of the diamond of FIG. 2 following the ion implant and heating according to an example embodiment.

FIG. 4 is a side view cross sectional representation of the diamond 210 of FIG. 2 following the ion implant and heating to form an open space 410 within the diamond 210. Open space 410 provides a low refractive index region on one side of a strip of diamond indicated at 420. The other side of the strip 420 is essentially the top of the diamond 210, which may be exposed to air, also having a low refractive index compared to the index of refraction of the diamond strip 420. Thus, the diamond strip 420 forms a waveguide. A Qubit 430 is formed within the strip 420, and the strip provides a mechanism to capture and provide light to the Qubit to both detect and effect changes in the Qubit. It is evident that the strip 420 may be formed in different shapes, in order to conduct the light to a desired light source 440 and a light detector 450 which may each be further connected to processing circuitry, formed either, within, on, or off of the diamond substrate. The source 440 and light detector 450 may also be within, on, or off the diamond substrate in various embodiments. Optical fiber connections or optical couplers may be formed to conduct light to and from the waveguide strip 420.

In one embodiment, patterned ion implantation is employed to deliver one or more atomic species into and beneath the diamond growth surface in order to form an implanted layer with a peak concentration of atoms at a predetermined depth beneath the diamond growth surface. The composition is heated in a non-oxidizing environment under suitable conditions to cause separation of the synthetic diamond structure.

Such a non-oxidizing atmosphere generally includes any atmosphere not containing a sufficient concentration of oxygen so as to be reactive through oxidation. Examples of such atmospheres include inert (e.g., helium, neon, argon, etc.) and other non-oxygen containing gases (e.g., hydrogen, nitrogen, etc.). Environments used to provide such atmospheres can include plasmas, vacuums, and the like.

In certain embodiments of the invention, various initial steps can be performed prior to or concurrent with the ion implantation stage. One such step involves choosing a substrate. When growing single crystalline CVD diamond, for instance, such substrate may be a single crystalline diamond.

Upon selection of the substrate, at least one major surface of the substrate can be identified, and optionally prepared, for ion implantation. Preparation of the diamond surface can include any suitable means for affecting the chemical and/or physical make-up of the surface, for instance, by polishing using conventional polishing methods. Preparation of this sort can be accomplished in advance of the ion implantation. Typically, ions are implanted in a manner at a set distance and even flux across the diamond growth surface, such that the configuration of the implanted species layer will itself replicate the surface profile of the substrate. In turn, any defects on an implanted surface of the substrate will typically have a corresponding influence on the implant profile, including on the configuration of the predetermined peak atomic layer. Thus, such structures may actually be substantially polished if the surface of the diamond is polished. Preparation of the substrate can be important to initially remove such defects. In addition, in certain embodiments, surfaces are thoroughly cleaned for ion implanting, for instance, using solvents or other suitable methods known in the art, including plasma etching, gas phase etching and the like. Polishing damage may result in creation of undesired N-V centers. The surface of the polished diamond may be further etched to remove such damage and N-V centers.

Ion implantation is generally conducted under conditions of high vacuum, high voltage, and relatively low beam currents. As is known in the art, ion implantation typically involves the process of ionizing a species of atoms, subsequently accelerating the species in an electric field, and directing the accelerated, ionized species toward a substrate. With its rate of motion being accelerated, the species generally penetrates an outer surface of the substrate and come to rest within a zone in the substrate as indicated at 225 in FIG. 2.

The zone is within an implanted layer of the substrate. In one embodiment, the species is accelerated toward the substrate at an angle generally normal or vertical to the surface. However, the species can also be accelerated toward the substrate at a wide variety of angles as well. For a given species, the depth of implantation is generally accomplished with adjustments made to the electric field. Typically, as one increases the voltage of the electric field, the energy of the species is increased, which ultimately results in a deeper implantation by the species into the substrate. It is fully contemplated that the substrate may be any of a variety of crystalline shapes. For example, the substrate may be of any predetermined geometry including a cube, cone, prism, pyramid, wedge, or other geometries, as well as frustums of each.

The species generally penetrates the upper surface of the substrate until reaching a zone, such as zone 225 within the substrate. A peak concentration of the species is at a certain depth generally known as the end of range depth. While the species is only shown at the one depth (the end of range depth), it should be appreciated that this is done for simplicity. Following ion implantation, the species is generally distributed throughout the zone at and proximate to the end of range depth.

Before ion implantation is started, the species to be implanted must be selected. Many variables are considered in selecting a species, such as cost and availability, as well as concern for how much damage the species is expected to cause to the substrate lattice, as described below.

During ion implantation, by directing the species (of ionized atoms) into the crystal lattice of the substrate, the implanted portion of the lattice generally dilates or expands. Excessive dilation of the lattice in this manner generally leads to strain within the implanted layer. Consequently, excessive strain can cause damage to the implanted layer. This damage is generally represented by dislocations, or cracking, within the implanted layer. These dislocations can generally create an unfavorable outer substrate surface for growing quality synthetic diamond (e.g., producing diamond via CVD having no defects or dislocations, or insignificant amounts thereof). However, the manner in which lattice dilation can be controlled in a number of ways, and in fact, relied upon.

One way involves selecting an appropriate species for implanting. In certain embodiments of the invention, hydrogen ions are implanted within a diamond substrate using the conventional techniques of ion implantation. Since the covalent radius of hydrogen is small, only a small amount of lattice dilation occurs within the implanted layer. Consequently, there is little strain (and little damage) within the implanted layer. Generally, as the covalent radius of the implanted species increases, the potential for creating such a favorable surface (e.g., having limited defects or dislocations) decreases.

Generally, any species can be used for ion implanting in the inventive process so long as the species is suitable for subsequently enabling separation of a portion of the implanted layer from the substrate. As such, the species is selected so as to allow for suitable implantation within the substrate. Examples of such species include most, if not all, atomic elements. In certain embodiments of the invention, the substrate is also used for growing a synthetic diamond thereon. As such, the species preferably allows for suitable implantation within the substrate to enable separation, and allows for suitable formation of a favorable growth surface on the substrate from which a quality synthetic diamond can be grown. Therefore, the species is selected so as to allow for suitable implantation within the substrate without undesirably damaging the substrate. Small- to medium-sized species (having small- to medium-sized covalent radiuses) are generally preferred. Examples include atomic species such as helium, lithium, boron, carbon, oxygen, phosphorous, and sulfur. However, embodiments of the process can also involve large-sized species (having large-sized covalent radiuses). In such embodiments, other parameters affecting the implant of the species, such as species dose quantity and species energy level, are considered so as to limit the amount of damage to the substrate lattice upon implantation of the larger-sized species.

The extent of lattice damage to the implanted portion can be limited by the dose quantity of the species implanted, with the dose being defined as the area density of atoms (atoms/$cm^2$) which are implanted into the substrate. For example, if the species is implanted using a high dose, the species will generally cause more damage to the substrate upon implantation than if a species were implanted using a lower dose. As the species (of ionized atoms) travels through the substrate, the damage to the substrate lattice is generally maximized near the end of the species range into the substrate (generally referred to as "end of range damage").

In turn, the degree of damage at the end of range is a function of the total dose at that level. However, the ability to cause separation within the diamond crystal is also a function of the total dose. At dose levels that are too low, there will be no separation, while at levels that are too high for a particular embodiment, there can be excessive damage and poor diamond growth. In some embodiments, the dose quantity is set in the range from about $1\times10e^{14}$ atoms/cm² to about $1\times10e^{20}$ atoms/cm², and even more preferably, is set in the range from about $1\times10e^{15}$ atoms/cm² to about $1\times10e^{18}$ atoms/cm². When implanting species of large sizes, in order to limit lattice damage, it is generally preferable to choose a dose quantity on the lower end of the range. Conversely, when implanting species of small to medium sizes, any dose quantity within the range is generally suitable.

In addition, the extent of lattice damage to the diamond growth surface can be controlled by modifying the voltage of the electric field used in ion implantation. As one increases the voltage of the electric field, the energy of the species increases as well, ultimately resulting in a deeper implantation by the species into the substrate. In turn, the energy level can be selected for a specific species so as to implant a peak concentration of the species at about a certain implantation depth within the substrate (the end of range depth). This depth may range anywhere from about 500 angstroms to about 20,000 angstroms. While the end of range depth for the species can be limited by decreasing the species energy, one ought not to limit the energy too severely.

In some embodiments of the invention, the energy level is set in the range from about 10 KeV to about 10,000 KeV, and in another embodiment, is set in the range from about 50 KeV to about 500 KeV. When implanting species of large sizes, in order to limit lattice damage of the substrate, it may be desired to select the species energy on the higher end of this range. As such, the large size species are implanted further from the diamond growth surface, thereby attempting to isolate any lattice damage from the diamond growth surface. Conversely, when implanting species of small to medium sizes, the method provides more freedom in selecting the species energy.

The species dose rate may affect the temperature of the substrate during the implant. If the dose rate is too high, unwanted graphitization of the zone of the implanted layer may occur. In some embodiments of this invention, the dose rate is set in the range from about 0.05 microamps/cm² to about 100 milliamps/cm², and in others, is set in the range from about 0.1 microamps/cm² to about 500 microamps/cm².

In one embodiment, implants at multiple levels, followed by heating are performed to create gaps at different levels of the substrate. One example provides three such gaps by implanting $H_2$ at energy levels of 150, 155 and 160 KeV. This can provide three levels of structures, such as waveguides, with potential corresponding isolated N-V centers.

Given the present description, those skilled in the art will appreciate the manner in which the end of range depth of the species can be determined, given specifics regarding the species implanted and the energy used. Such calculations are generally known as TRIM (Transport of Ions in Matter) calculations. See J. P. Biersack et al., *A Monte Carlo Computer Program for the Transport of Energetic Ions in Amorphous Targets*, Nucl. Instr. Meth., pp. 174:257 (1980), the teachings of which are incorporated herein by reference. See also generally J. F. Ziegler et al., *In the Stopping and Range of Ions in Matter*, Pergamon Press, N.Y., vol. 1 (1985), the teachings of which are incorporated herein by reference. Table 1 lists the approximate end of range depths for various species at various energy levels, given a diamond seed being used as the substrate. Regardless of whether the diamond seed is HPHT, CVD, or natural diamond, the end of range depths for the species generally remain the same. As illustrated, as the energy level is increased for a species such as hydrogen, its end of range depth is also increased. Calculations were run at an energy level of about 200 keV for species including boron and carbon to demonstrate that as the atom diameter of the species increased, the corresponding end of range depth decreased. In addition, it should be noted that in order to achieve similar end of range depths (e.g., 1900 angstroms to 2000 angstroms), energy levels would have to be increased by a factor of four when using carbon as the implant species as opposed to hydrogen.

TABLE 1

Implant Depths as a Function of Atom Implanted and Implant Energy

| Implanted | Implant Energy | | | |
|---|---|---|---|---|
| Ion/atom | 50 keV | 100 keV | 200 keV | 1,000 keV |
| Hydrogen | 1900 Å | 3700 Å | 7200 Å | 63500 Å |
| Boron | | | 2800 Å | |
| Carbon | | | 2000 Å | |

Heat treatments are provided on the diamond composition in the non-oxidizing atmospheres. Such treatments can be provided by any suitable method, including radiation, conduction, or convection sources, all generally known in the art. Generally, the temperature range of the heat treatments is preferably set in the range from about 1100° C. to about 1800° C. and, more preferably, about 1100° C. to about 1500° C. The combination of the appropriate atmosphere and the temperature levels provides an ideal environment to cause spontaneous separation of the synthetic diamond and the implanted layer portion.

Figure 5:
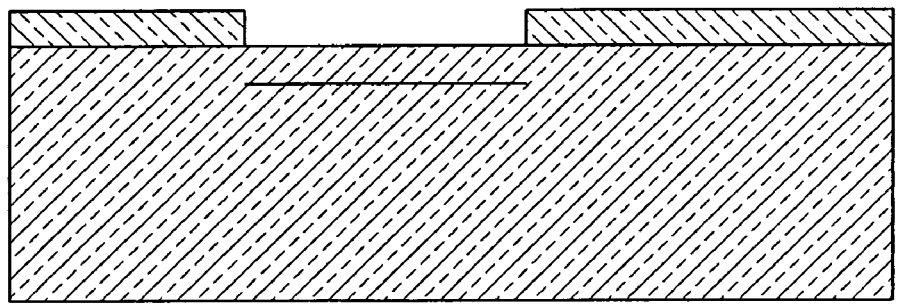
FIG. 5 is a side view cross sectional representation of a diamond illustrating a masked ion implant process for forming a cantilever according to an example embodiment.

FIG. 5 is a side view cross sectional representation of a diamond illustrating a masked ion implant process for forming a cantilever according to an example embodiment. In this embodiment, a first mask is used to form a generally rectangular area which will end up defining the size of a cavity in which the cantilever will be released to be free to move. As can be seen, shapes other than rectangular may be used. Depending on the size of elements desired, the implantation depth may be varied, such that a sufficient density of ions are implanted in the entire area beneath the cantilever and to the sides of the cantilever to allow sufficient motion once the cantilever is released to move. Thus, the mask extends at least slightly beyond the edges and released end of the cantilever.

Figure 6:
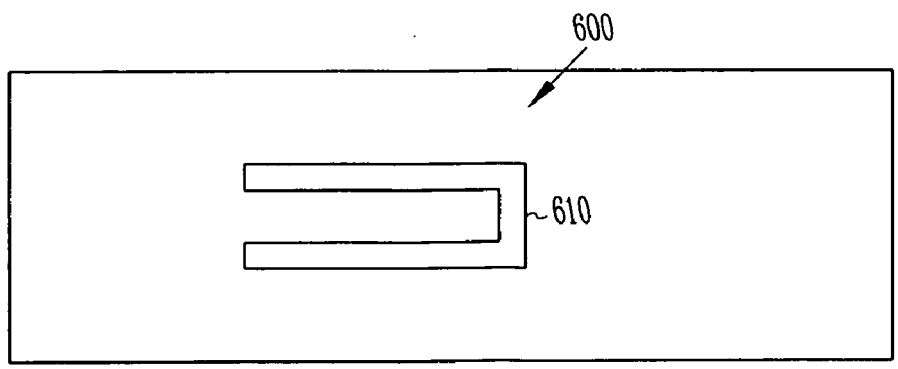
FIG. 6 is a top view representation of an ion implantation mask used to form a cantilever according to an example embodiment.
Figure 7:
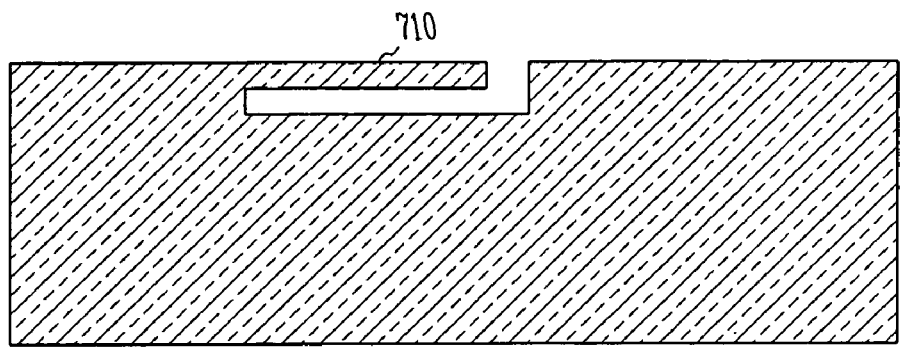
FIG. 7 is a side view cross sectional representation of a released cantilever according to an example embodiment.

Following ion implantation to form the base of the cavity, a new mask is used as shown in FIG. 6, which is a top view representation of an ion implantation mask 600 used to form a cantilever according to an example embodiment. This mask allows implantation to the sides and past the released end of the cantilever, while defining the shape of the cantilever itself with projection 610. The energy levels of implantation used with this mask are designed to implant a sufficient density of ions to the sides and released end of the cantilever. This implant may vary the depth of implant from the surface of the diamond substrate to the cavity defined below the cantilever. Thus, heating in a non-oxidizing environment released the cantilever as shown in FIG. 7, which is a side view cross sectional representation of a released cantilever beam 710 according to an example embodiment. Alternatively, releasing may be performed using a carbon implant at the edges and etching by oxidation via heat, electrolysis or oxidizing acid.

In one embodiment, cantilever beam 710 tends to curve upward when released. Further implants in the upper levels may be provided either prior to or after release of the cantilever beam. Such implants, depending on depth and density, will begin to straighten the cantilever by putting the surface in compression, and if continued, may actually cause the cantilever beam to curve downward.

As can be seen from the formation of the cantilever beam 710, many other three dimensional structures may be created with the use of one or more masks, and varying the depths of multiple implants to remove desired materials. Such structures may also be further cleaned in acid solutions to remove undesired residual implanted diamond material. The structures may be used for many different applications, including NEMs and MEMs devices have general applications. Such devices may be useful as sensors and other mechanical devices having a wide variety of applications beyond Qubit devices, such as medical devices.

Figure 8:
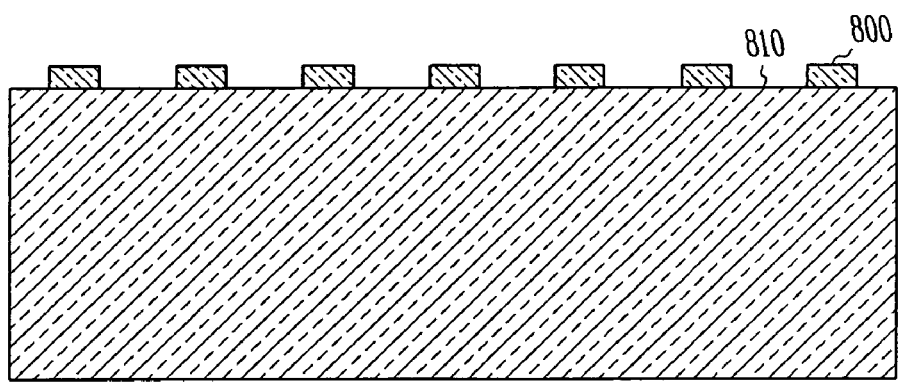
FIG. 8 is a side view cross sectional representation of a masked diamond for forming optical structures according to an example embodiment.
Figure 9:
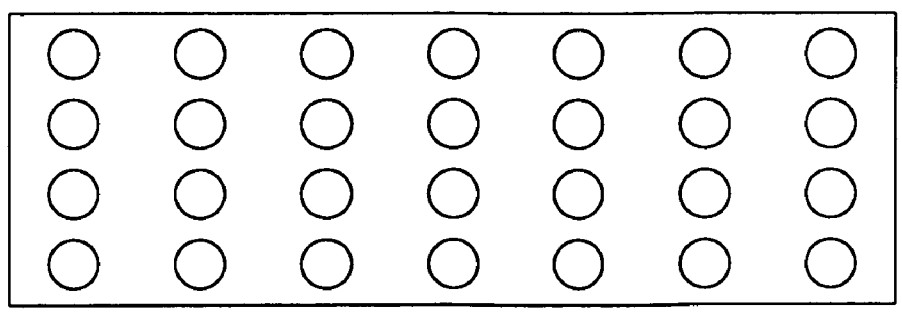
FIG. 9 is a top cross sectional view of the diamond of FIG. 8 illustrating optical structures formed according to an example embodiment.

FIG. 8 is a side view cross sectional representation of a masked diamond for forming optical structures according to an example embodiment. In one embodiment, the mask 800 comprises an array of one or more multiple round openings 810. The resulting implants at a desired depth followed by heating, forms an array of disk like voids 910, as shown in FIG. 9, which is a top cross sectional view of the diamond of FIG. 8. The disk like voids 910 may behave as a pump, or optical deflector in one embodiment. When formed near the surface of the diamond, the surface of the diamond bubbles up slightly. These bubbles can result in optical fringe effects, including color changes. In one embodiment, the disks are approximately 500 nm in diameter. Other shapes and sizes may easily be formed.

In one embodiment, further masks and implants may be used to fully release the diamond above each of the disk like voids, to create small lens like structures. Such structures may be of desired thicknesses tied to the implant levels. In one embodiment, the lenses are approximately 50 um thick, forming an etalon or optical filter. It should be noted that lasers and other method of releasing the lenses may be utilized in addition to varying depth implants and heat to release the lenses. In some embodiments, thicknesses of less than 1 um are utilized. The thickness may also be a function of the desired wavelength of operation of the optical device including such structures.

Medical Applications

Diamond appears to be highly biocompatible with living tissue. Currently, diamond does not appear to exhibit carcinogenetic or toxicity for in situ applications, and it appears to be biologically inert in bulk form. Thus, it is a very desirable material to incorporate on medical devices, orthopedics, instruments, tools, sensors and other structures for use within living creatures, including humans. Such medical structures may be formed from CVD diamond directly, using the above identified processes, or from materials that are currently used, and then coated with CVD diamond to provide enhanced biocompatibility. The coating may be applied by coating desired surfaces, or the entire structures with nanocrystalline diamond, and the growing a thin layer of CVD diamond on such surfaces. Such a diamond layer may be made conductive by including desired dopants, or may be non-conductive if desired.

In one embodiment, a 50 nm coating of CVD diamond is sufficient to provide desired characteristics. Such characteristics include biocompatibility, as well as the ability to inhibit oxidation of the structures they are coating. In one method, nanocrystalline diamond is used to seed the structure where desired. The nanocrystalline diamond is commercially available, and may be suspended in alcohol for application to the structure. The structure may be dipped in the alcohol, and the alcohol allowed to evaporate, leaving a desired amount of diamond seed on the structure. An adhesive carrier for the diamond seed may also be used, such as photoresist, which may then be evaporated. The CVD diamond layer may be formed from the seed, such as growing from the seeds at various process temperatures, such as between 500 to 1000° C., or approximately 200° C. depending on the thermal budget of the structures, or their tolerance to heat. The CVD diamond is grown on the seeds sufficient to cover desired portions of the structure with CVD diamond. Multiple such coatings may be performed to cover the entire structure.

Some applications include surgical scalpels and drill bits. The CVD diamond coating provides increased durability. For drill bits, such as dental, neuro, or orthopedic type drill bits, the CVD diamond structure or coating may provide increased durability, and in addition, can permit a desired level of sharpness without increased erosion of the drill bit. A duller drill bit may have a desired property of providing increased control of drill rates.

In further applications, orthopedic devices may have improved performance. Ball and socket or cub mechanisms forming artificial knee, hip, shoulder and elbow joints may be selectively coated with CVD diamond, or in some embodiments, entirely created from CVD diamond. Further devices, such as spinal disc replacements, screws, plates, nodes, etc may be formed of diamond, or coated with CVD diamond.

Cardiovascular applications for CVD diamond formed or coated devices include catheter systems, such as rotator blades for cleaning arteries, stents, and heat valves may all have increased lives because of associated reduction in wear and tear rates.

Nano medical applications include the use of CVD diamond to encase devices that deliver proteins, recombinant protein, and/or retrovirus, endovirus, and plasmid technologies.

Figure 10:
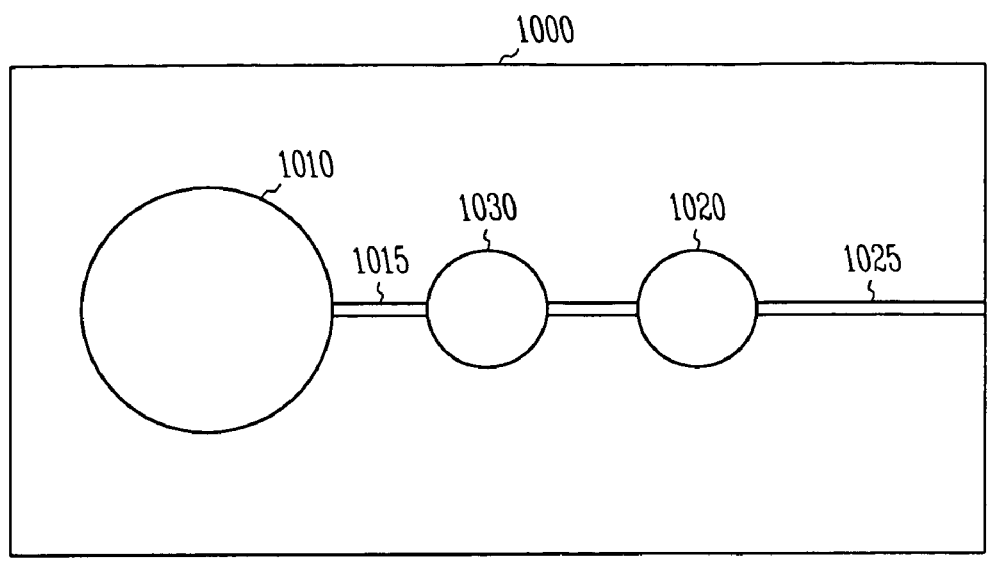
FIG. 10 is a top view representation of a drug pump according to an example embodiment.

The above masked implantation processes may be used to form many different medical related devices. Using the above described implant techniques, drug delivery devices can be formed, which may be implanted within a living creature. One example of such a device is shown in a simplified block diagram in FIG. 10 at 1000. A reservoir 1010 containing a drug, is formed in diamond, silicon, or other substrate material using methods suitable for the corresponding materials. When formed of silicon, many basic photolithographic techniques may be used to form structures. Sacrificial layers may be used to form the reservoir 1010, and a first tube or conduit 1015 to a pump 1020, which is a small, bubble-like structure having the ability to have its volume controlled by desired actuation. The pump 1020 is further connected to an output tube or conduit 1025, for injecting fluids.

Pump 1020 may be actuated by application of voltage, or mechanically by use of piezoelectric material to cause the bubble to controllably collapse and reform. This results in a nanofluidic switch or pump. The silicon device 1000 may then be coated with CVD diamond as described above. Two applications of CVD diamond may be used, with the device turned over for the second application to coat a bottom of the device.

When device 1000 is formed of diamond, such as CVD diamond, different forms of ion implant and annealing may be utilized to form the structures. Smaller structures, such as tubes 1015 and 1025 may be formed by hydrogen ion implant and anneal. In further embodiments, larger structures, such as reservoir 1010 and pump structure 1020 may be formed by implant of a larger ion species, such as carbon, with multiple energy levels if desired. Such an implant may form graphite in the diamond, which can then be etched by use of oxidation and using sulfuric nitric acid, which attacks the graphitic layer. The acid may be introduced through the tubes 1015 and 1025. In one embodiment, tubes 1015 and 1025 are formed as a single continuous tube, providing access for subsequent etching of reservoir 1010. Such a process of forming larger openings conserves thermal budgets over hydrogen implant and anneal processes.

In further embodiments, a masked carbon ion implant of various energy levels may be used to create a via from the reservoir 1010 to the surface of the device 1000. This provide access for easier etching, and also for quicker loading of the device with desired drugs. Circuitry may also be provided to supply controlled voltages or suitable pressure to surfaces of the pump 1020, to provide actuation of the pump. In still further embodiments, an additional pump or bubble 1030 may be formed such that there are two pumps between the reservoir and exit conduit. When operated in the proper sequence, they ensure that fluid is pumped in the desired direction. While the shape of device 1000 is shown as rectangular, the actual shape may be varied as desired for compatibility with in situ applications. The sizes of tubes and reservoirs may also be varied to achieve desired operating parameters.

Figure 11:
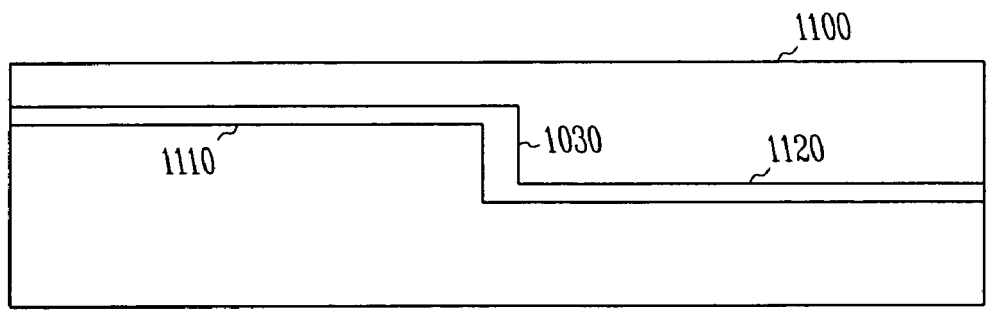
FIG. 11 is a side cross section view of a multilevel capillary system according to an example embodiment.

In one embodiment, capillaries and other fluidic structures may be formed in multiple levels in a diamond using the above techniques. Single crystalline diamond, nanocrystal on single crystal and polycrystalline on top of single crystal diamond may be used for structures. In one embodiment, such as a device 1100 in FIG. 11 may be formed with interconnects between levels. A first level capillary 1110 is formed using a first masked implant at a low voltage. A second level capillary 1120 is formed at a lower level in the device 1100 using a higher energy masked implant. An interconnect or via 1130 is formed between the two capillaries 1110 and 1120 by using one or more implants of the same or a different species.

Multiple implants at varying energy levels may be used to form the via. An anneal is used to open the capillaries, and may also serve to open the via. If the via is formed using a carbon ion implant, etching as described above may be used to open the via. The etchant may be provided through the open capillaries if desired. Electrolysis with water and a current applied between ends of the capillaries may also be used to remove the graphitic material.

Multiple capillaries and vias may be formed in and between multiple levels in various embodiments to form complex fluidic structures. The above bubbles may be integrated into the capillaries and operate as switches or pumps between intersecting capillaries or channels. Reservoirs and other desired structures may be added, including diaphragms, cantilever beams and beams supported on both ends may also be formed to provide multiple different functions. Since the devices are formed of diamond, or may be coated with CVD diamond, they are highly biocompatible for in situ applications.

The capillaries may be formed with varying dimensions, such as from 5 to 10 nm wide to millimeter range widths. They may also be formed as long as desired. Both dimensions are controlled by masking the implantations used to form them.

In one embodiment, capillary 1110 is formed with a portion of the capillary doped to make it conductive. The doping may be provided during formation of the diamond device 1100 such that the top of capillary 1110 is conductive, with the remainder of the tube having insulative properties of undoped CVD diamond. Electrical pulses may be used to close off the capillary or open it, thus operating as a switch. In a further embodiment, electrodes may be placed on either end of the conductive portions of the capillary to measure conductivity of fluid within the capillary.

Figure 12:
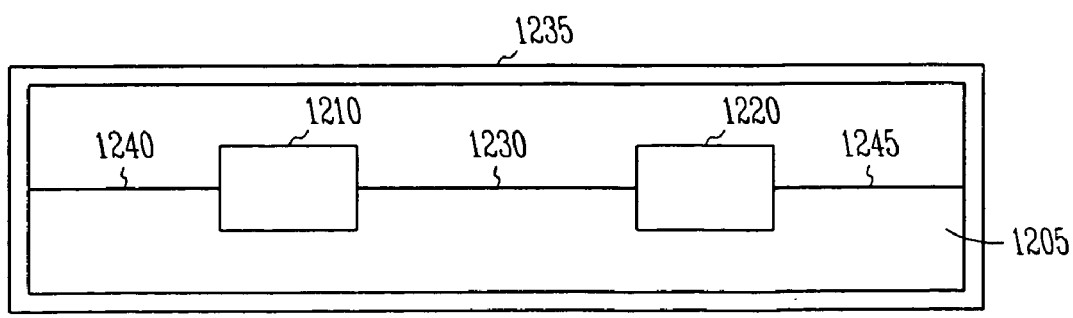
FIG. 12 is a block cross section view of a CVD diamond coated optical device according to an example embodiment.

In still further embodiments, optical sensors and emitters may be embedded in a diamond, or coated with CVD diamond as shown in block diagram in FIG. 12. A silicon substrate 1205 has an optical emitter 1210 coupled to an optical detector 1220 by a waveguide 1230. A CVD diamond coating 1235 is used to encapsulate the silicon structures. The diamond coating 1235 serves to protect the silicon structures and prevent oxidation of them. Thus, they may be used implanted into living beings and be biocompatible. In one embodiment, a conductive input path 1240 extends from optical detector 1210 through the diamond layer, such as by doping both the silicon and diamond layer to form a contact in the diamond layer. A conductive output path is formed at 1245, and extends from the optical detector 1220 to the outside of the diamond coating 1235. The input and output may be used as a neural conductor in some embodiments. In further embodiments, various combinations of silicon and diamond may be constructed as described below with respect to boron doping of diamond semiconductor. Various other optical and electrical detectors formed of silicon or gallium arsenide or other semiconductor materials may also be encased or selectively coated with CVD diamond. In some embodiments, the diamond conductive portion extends from one end of the diamond to the other, providing a diamond based neural connector.

Figure 13:
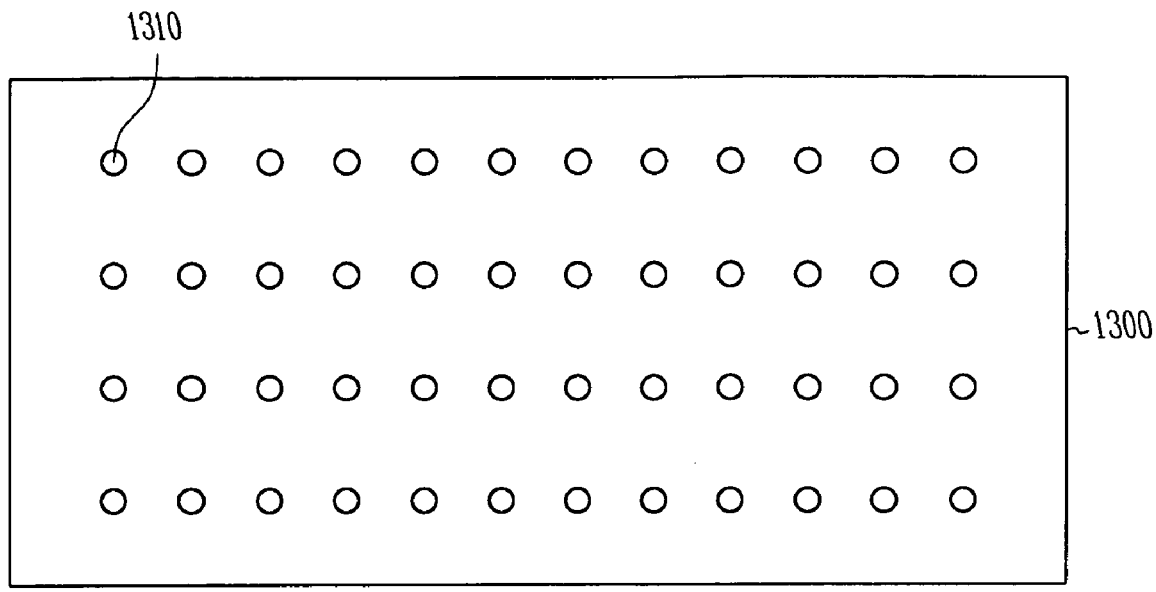
FIG. 13 is a top view of a porous CVD diamond membrane according to an example embodiment.

In a further embodiment, as shown in FIG. 13, a sheet of diamond 1300 of desired thickness may be used to create a porous membrane. 10 nm to micron size or larger pores 1310 may be created, such as an array of pores to create membranes with desired filtering properties. The pores may be creased by masked ion implantation and annealing or etching as described above. Since diamond is highly biocompatible, many in situ applications are possible. The membranes may be significantly varied in thickness in some embodiments depending on application and surface area. The sizes and arrangement of the pores may be varied beyond these specified limits.

Figure 14:
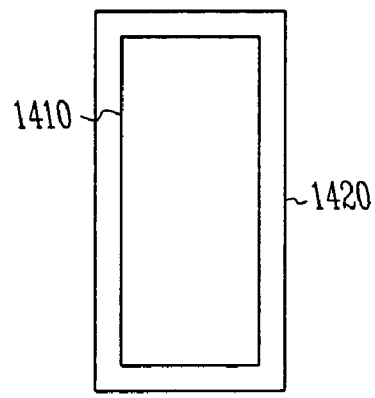
FIG. 14 is a block diagram representation of a structure coated with CVD diamond.

FIG. 14 is a representation of a structure 1410, such as one of the structures described above, including prosthetic devices, implantable medical devices, tools, etc. selectively coated with CVD diamond 1420. It is in block diagram form, since many of such structures are well known. While the entire structure 1410 is shown as coated, only a portion need be coated with CVD diamond. The CVD diamond 1420 may be single crystalline, nano-crystalline or poly crystalline depending on application.

Boron Doping of Single Crystal CVD Diamond and Circuitry Creation

One example embodiment provides first and second synthetic diamond regions doped with boron. The second synthetic diamond region is doped with boron to a greater degree than the first synthetic diamond region, and in physical contact with the first synthetic diamond region. In a further example embodiment, the first and second synthetic diamond regions form a diamond semiconductor, such as a Schottky diode.

Figure 15:
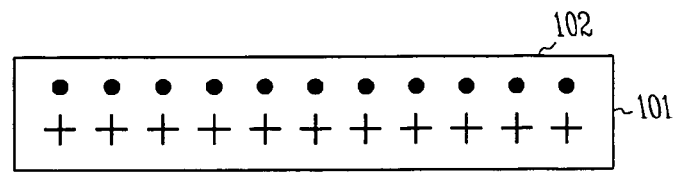
FIG. 15 shows a boron-doped diamond seed crystal with a hydrogen ion implant layer, consistent with an example embodiment of the present invention.

FIGS. 15-18 illustrate a method of producing a monocrystalline synthetic diamond Schottky diode, which is one example of a diamond semiconductor device such as can be produced using the present invention. FIG. 15 illustrates a diamond seed crystal that is heavily doped with boron, which has only three valence electrons relative to carbon's four valence electrons, making the diamond a strongly p-type semiconductor material. The absence of electrons in sites in the diamond that contain boron leaves a "hole" that is receptive to electrons, making what is in effect a mobile positive charge. The negatively charged boron atom is fixed in the diamond lattice, meaning that the boron atoms cannot move but contribute holes as electron receptors to the electrical conduction process.

In some examples, the boron is grown into the diamond as the diamond is formed by chemical vapor deposition, or is incorporated by another process, while other examples use diffusion or ion implantation to implant boron into diamond, whether the diamond is synthetic or naturally occurring. The diamond contains boron doping through at least a top region of the seed diamond 101 extending a half micron to a few microns, such that a top layer has a relatively uniform distribution of boron atoms distributed to a desired density.

The seed 101 is polished to have a flat top surface, and the edges of the seed are trimmed such as with a laser or cutting tool, and are cleaned, etched, and polished. Hydrogen atoms are then implanted to a desired depth, as is shown in FIG. 15 at 102. The hydrogen atoms are implanted under various conditions in various examples, but in one example are implanted at an angle of ten degrees relative to the diamond surface, and at a dose rate of approximately one microamp per square centimeter. The electrons are implanted with an energy of approximately 200 KeV, until the total dose of approximately ten to the seventeenth atoms per square centimeter are implanted into the diamond 101. Varying the parameters of the hydrogen implant will vary the depth and density of the resulting hydrogen implant layer. The hydrogen implant layer is shown as the dotted layer 102 of FIG. 15.

Once the hydrogen implantation into the boron-doped diamond seed is completed, more diamond is grown on the seed, such as via a chemical vapor deposition plasma reactor. Various technologies that can be employed for diamond formation in other examples, including microwave plasma reactors, DC plasma reactors, RF plasma reactors, hot filament reactors, and other such technologies. The formation of synthetic diamond can be achieved through a variety of methods and apparatus, such as that described in U.S. Pat. No. 6,582,513, titled "System and Method for Producing Synthetic Diamond", which is incorporated by reference.

The diamond grown in one example is a monocrystalline synthetic diamond uses a stream of gas, such as methane or other gas, to provide the precursor material for the plasma reactor to produce a plasma that precipitates to form diamond. The gas in some examples or in some layers of the diamond contains various impurities, such as boron dopants or various isotopes of carbon. For example, diamonds having a greater than average purity of carbon-12 and a corresponding reduced concentration of carbon-13 isotopes are known as isotopically enhanced, and are particularly thermally conductive. This makes them well-suited for applications such as semiconductor device fabrication, enabling higher power and higher density than can otherwise be achieved. Isotopic enhancement of the diamond CVD precursor gases with carbon-12 can result in a diamond having significantly less than the typical 1.1% carbon-13 concentration, resulting in thermal conductivity as high as 3300 W/mK. Other examples of methods of producing synthetic diamond with high thermal conductivity include growing diamond in a low nitrogen environment, growing synthetic diamond in an environment rich in hydrogen, and using boron doping resulting in an increase in thermal conductivity.

In some embodiments, diamond regions having boron or other dopants implanted will have somewhat larger or smaller lattice structures than undoped diamond as a result of placement of the dopant within the diamond crystal structure. The lattice mismatch between diamonds having different doping concentrations or between doped and undoped diamonds is controlled in some embodiments by implantation of ions selected to give the desired lattice structure. For example, a lightly boron-doped diamond region will have a lattice structure somewhat expanded relative to undoped diamond made from primarily carbon-12. Adding carbon-13 to the boron-doped diamond shrinks the lattice structure, and is used in some embodiments to eliminate the lattice mismatch between diamond layers or to control the lattice mismatch or strain between diamond layers.

In a more detailed embodiment, a first lightly boron-doped region is grown in contact with a second more heavily boron-doped region, in a diamond structure comprising approximately 99% carbon-12 and 1% carbon-13. Addition of more carbon 13 to the second more heavily boron-doped region enables matching the lattice structures of the more heavily boron-doped and less heavily boron-doped diamond regions to one another, reducing or eliminating lattice strain at the boundary between diamond layers.

Figure 16:
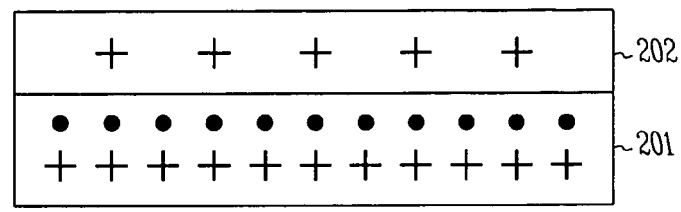
FIG. 16 shows a boron-doped diamond seed crystal with grown boron-doped diamond, consistent with an example embodiment of the present invention.

FIG. 16 shows the see diamond of FIG. 15 with a hydrogen implant layer 201 that has another synthetic diamond layer 202 that is boron-doped grown on the surface that was implanted with hydrogen. In some examples, the seed 201 is polished flat before hydrogen implantation or at some other point before growth of the second synthetic diamond region 202, and is trimmed to a desired size or shape such as by laser cutting before or after growth of the second synthetic diamond region. The top layer is grown to a desired thickness, such as 100 microns in one example, and is then polished and cut to form the diamond assembly shown in FIG. 16.

The assembly of FIG. 16 is then heated to a temperature sufficient to cause separation of the first diamond region 101 at the hydrogen implant level, resulting in a portion of the seed diamond region 101's becoming detached with the grown synthetic diamond region 202. This operation results in a seed diamond 301 that is somewhat smaller than the original seed diamond 101, due to the more heavily boron-doped diamond portion 302 that is removed with the more lightly boron-doped portion 303. The resulting structure of 302 and 303 in FIG. 17 forms the semiconductor portion of a Schottky diode, which is able to operate at particularly high voltage and power levels due to the characteristics of diamond when compared to other semiconductor materials such as silicon. In other examples, the grown region will be more heavily doped with boron than the seed region, the thicknesses of the diamond regions will differ, and other structural and design changes will be made.

Figure 17:
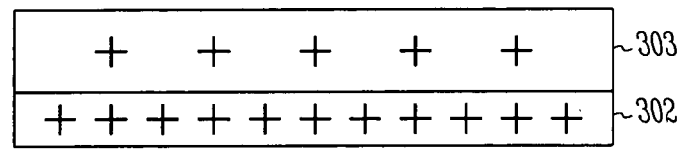
FIG. 17 shows a boron-doped diamond seed crystal with grown diamond separated at a hydrogen implant level, consistent with an example embodiment of the present invention.
Figure 17:
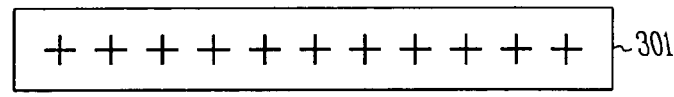
Figure 18:
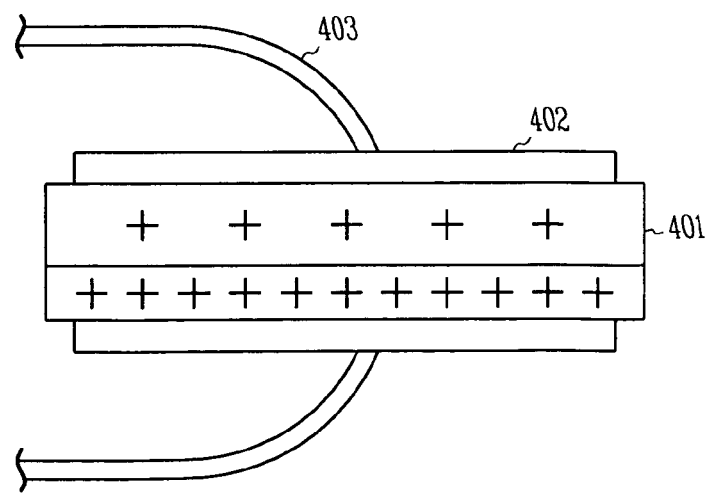
FIG. 18 shows a Schottky diode formed from the boron-doped diamond seed crystal with grown boron-doped diamond, consistent with an example embodiment of the present invention.

FIG. 18 shows the diamond assembly formed by 302 and 303 in FIG. 17 that was lifted off the diamond seed region at 401, with electrical leads attached at 402 and 403. The metal attached is selected based on the metal's work function or fermi function and the desired characteristics of the Schottky diode, and will typically be a metal or metal alloy containing metals such as aluminum, platinum, gold, titanium, or nickel. This forms a completed Schottky diode, which is similar to other types of diode in its ability to rectify some signals, or to pass current in only one direction under certain circumstances. Looking at the Schottky diode of FIG. 18, the terminal 403 is known as the anode, and terminal 402 is known as the cathode. When the anode is at a potential that is higher than that of the cathode by a certain voltage level, current will flow through the diode, but when the anode is lower in potential or voltage than the cathode current doesn't flow through the diode. This property makes a diode useful for a wide variety of electronic applications, including detection, filtering, and shaping electrical signals.

The rectifying portion of the Schottky diode is actually the metal-to diamond semiconductor contact, rather than the interface between semiconductor materials as is the case in most other types of diodes such as p-n semiconductor diodes.

The theory of Schottky diode operation is well-understood but relatively complex, and results in a number of significant advantages over regular semiconductor diodes for many applications. The forward voltage drop across a Schottky diode is typically much less than across a typical p-n junction semiconductor diode, with typical values of 0.2 Volts drop across a Schottky diode and 0.6-0.7 Volts drop across a silicon p-n junction diode. The capacitance across a Schottky diode is also significantly lower, and the carrier recombination at the metal interface forming the Schottky diode barrier region is significantly faster than in p-n semiconductor junctions, on the order of ten picoseconds. This makes Schottky diodes particularly well-suited for applications such as high-frequency detection, mixing, and other such applications. The low noise characteristics of Schottky diodes relative to semiconductor p-n junction diodes further makes them desirable for use in low-level detection applications, such as radar or other radio detection.

Figure 19:
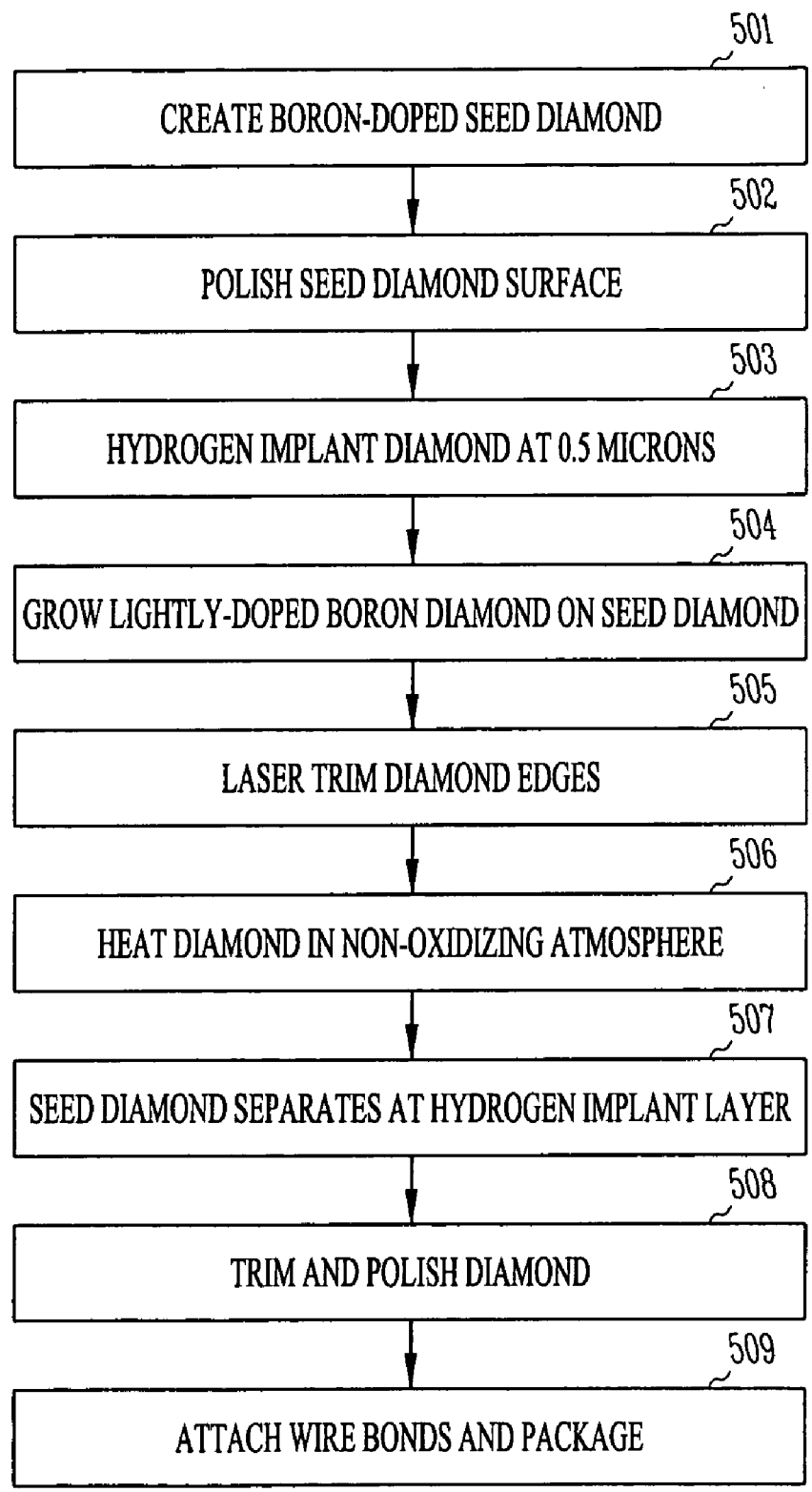
FIG. 19 shows a method of forming a boron-doped diamond semiconductor, consistent with an example embodiment of the present invention.

FIG. 19 is a flowchart of a method of making a boron-doped diamond semiconductor device such as that of FIG. 18. At 501, a boron-doped seed diamond is created. This can be achieved by ion implantation into a natural or synthetic diamond, by growing a synthetic diamond in an environment that is rich in boron, or by any other suitable method. Grown diamond can be produced by high pressure high temperature (HPHT) methods, by chemical vapor deposition, or by any other suitable method. The boron-doped seed diamond surface is polished at 502, to prepare a flat diamond crystal surface of a desired crystal orientation. For example, the diamond may be polished in the 100 plane, tilted two degrees toward the 110 plane, to produce a polished surface slightly off the 100 plane of the diamond. The edges of the seed may be cut and various other facets are polished or shaped in various examples, and the surfaces are cleaned with an acid wash, water rinse, and solvent dry.

Next, an implantation angle, energy, and dose are selected, and hydrogen ion implantation is performed at 503. The implantation parameters are configured to implant a selected density of hydrogen atoms at a selected depth in the seed diamond, as shown and described in FIG. 15. After hydrogen implantation, the implanted seed diamond is used as a seed for growing additional diamond, such as by chemical vapor deposition. The grown diamond in some examples includes either a higher or lower boron concentration than the seed diamond, as shown and described in FIG. 16. The diamond is grown until a desired thickness is reached, such as 500 microns thickness, or between 10 and 15,000 microns thick.

Once the growth process is complete, the diamond assembly is removed from the grower, and edges are trimmed with a laser cutter at 505. In other examples, the edges are trimmed using other methods, and may be polished or ground. The edges of the seed are thereby also trimmed to desired dimensions, such as back to the original seed dimensions before growth on top of the seed diamond region.

The resulting diamond assembly is heated in a non-oxidizing environment, such as in hydrogen or an inert gas, to an elevated temperature designed to cause the seed diamond region of the diamond assembly to separate at the area of hydrogen implantation. This separation occurs in one example at about 1200 degrees Celsius, while in other examples occurs within a range of 1100 to 2400 degrees Celsius. Once the seed and the grown diamond-seed diamond assembly separate, the grown diamond-see diamond assembly remains, as is shown in FIG. 17, with a portion of the seed diamond above the hydrogen implant layer attached to the grown diamond. The separation occurs spontaneously at elevated temperatures in some examples, but is cause by application of pressure across the hydrogen implant layer in other examples.

The result is a boron-doped semiconductor device that can be trimmed and polished further at 507, and that can be attached to wire leads and packaged for use as a semiconductor device as is shown at 509.

Figure 20:
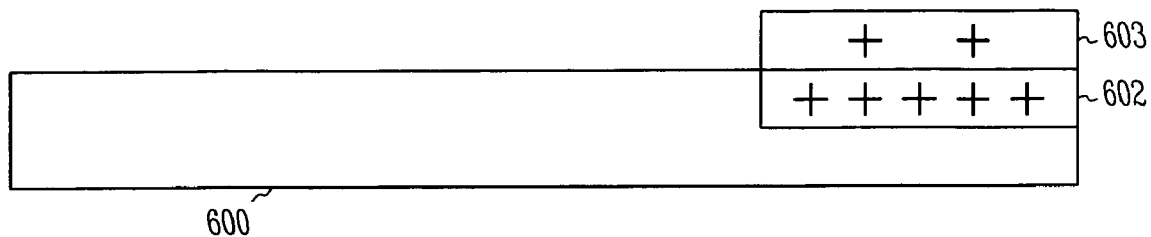
FIG. 20 shows an integrated circuit having first and second boron-doped diamond semiconductor regions, consistent with an example embodiment of the present invention.

Other embodiments of semiconductor devices consistent with various embodiments of the present invention include forming an integrated circuit, as is shown in FIG. 20. This figure shows generally a diamond semiconductor substrate at 601, which has at least a region or portion 602 that is boron-doped. A second region 603 is grown, implanted, or otherwise formed in contact with the diamond region 602, but with a different boron doping density. This forms the semiconductor portion of a Schottky diode, but similar processes can be used to form transistors and various other components. The elements 602 and 603 are coupled to a circuit using metallic wire having an appropriate work function, and in further examples are connected using polysilicon or other conductor or semiconductor elements to other portions of the integrated circuit.

Figure 21:
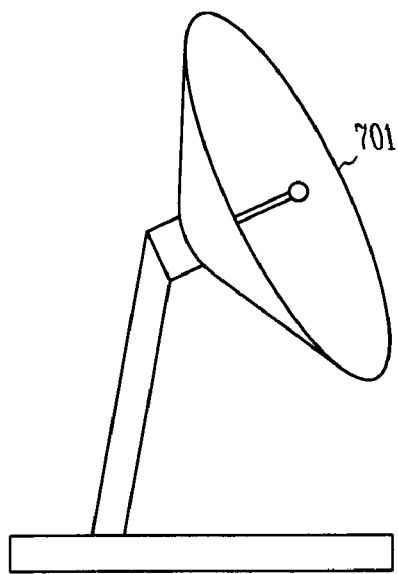
FIG. 21 shows an electronic device utilizing a boron-doped diamond semiconductor, consistent with an example embodiment of the present invention.

FIG. 21 illustrates an example of an electronic device that may be constructed, consistent with some example embodiments of the present invention. A radar apparatus 701 uses Schottky diodes for low-level, high-frequency radio detection, and for mixing in further example applications such as Doppler radar. The electronic device benefits from the increased performance possible with boron-doped diamond semiconductors, such as improved power handling, higher density, and higher performance relative to traditional semiconductors such as silicon.

Boron-doped diamond is also distinct from silicon-based semiconductors in that it is largely transparent, with a bluish tint. This makes boron-doped diamonds particularly well-suited for applications such as blue LED or laser semiconductor devices in configurations where light is emitted from other than an external surface of a semiconductor junction, in addition to other applications such as traditional LED or laser diodes. Because boron-doped diamond conducts electricity to some extent, it is also used in a variety of applications where conductivity is desired, such as in electrodes, in an electrically conductive cutting tool where the condition or other characteristics of the cutting tool can be electrically monitored, in conductive heat sinks or heat spreaders, and in optical windows that can be heated or that have an index of refraction that can be altered by current flow.

Schottky barrier junctions are further usable in a variety of applications other than Schottky diodes, including in use in bipolar junction transistors where a Schottky junction is located between the base and collector of the transistor. This prevents the transistor from saturating too deeply, resulting in faster switching times for the transistor. Metal-semiconductor field effect transistors (MESFETs) also use a reverse-biased Schottky barrier to provide the depletion region in the transistor, and works similarly to a JFET. Still other devices, including high electron mobility transistors (HEMTs) use Schottky barriers in a heterojunction device to provide extremely high conductance in a transistor.

It is anticipated that the methods and devices described here will apply not only to Schottky diodes and related devices, but to other semiconductors, integrated circuits, and electronic devices. Although specific embodiments have been illustrated and described herein, those of ordinary skill in the art will appreciate that a variety of arrangements which are calculated to achieve the same purpose may be substituted for the specific embodiments shown. This application is intended to cover any adaptations or variations of the invention. It is intended that this invention be limited only by the claims, and the full scope of equivalents thereof.

The Abstract is provided to comply with 37 C.F.R. §1.72 (b) to allow the reader to quickly ascertain the nature and gist of the technical disclosure. The Abstract is submitted with the understanding that it will not be used to interpret or limit the scope or meaning of the claims.

The invention claimed is:

1. A method comprising:
    forming a patterned mask on a single crystalline CVD diamond;
    exposing the diamond to ion implantation through the mask at a selected energy level;
    processing the diamond to form a void proximate the implanted ions corresponding to the pattern on the mask, and
    exposing the diamond to ion implantation through the mask at multiple selected energy levels,
    wherein the void has a depth that is dependent on the energy levels of the multiple exposures, and
    wherein the void comprises a vertical via between channels at different levels of the diamond.

2. A method comprising:
    forming a patterned mask on a single crystalline CVD diamond;
    exposing the diamond to ion implantation through the mask at a selected energy level;
    processing the diamond to form a void proximate the implanted ions corresponding to the pattern on the mask, and
    exposing the diamond to ion implantation through the mask at multiple selected energy levels,
    wherein the void has a depth that is dependent on the energy levels of the multiple exposures, and
    wherein the void comprises a vertical via between a reservoir in the diamond and the surface of the diamond.

3. The method of claim 1 wherein the ion implantation comprises hydrogen ions.

4. The method of claim 1 wherein the ion implantation comprises carbon ions.

5. The method of claim 1 wherein processing the diamond comprises heating the diamond to a temperature sufficient to cause separation of the diamond about the implanted ions.

6. The method of claim 1 wherein processing the diamond comprises etching the diamond about the implanted ions.

7. The method of claim 1 wherein the voids comprises fluidic structures.

8. A method comprising:
    forming multiple masks on a single crystalline chemical vapor deposition diamond;
    selectively exposing the diamond to ion implantation through the masks at selected energy levels; and
    processing the diamond to remove the diamond proximate the implanted ions corresponding to various patterns on the masks,
    wherein the masks and implantation levels are selected to form three dimensional diamond structures,
    wherein the three dimensional diamond structure comprises a released cantilever, and
    wherein the three dimensional diamond structure comprises a multilevel pattern of capillaries with a void connecting at least two capillaries on different levels.

9. A method comprising:
    forming multiple masks on a single crystalline chemical vapor deposition diamond;
    selectively exposing the diamond to ion implantation through the masks at selected energy levels;
    processing the diamond to remove the diamond proximate the implanted ions corresponding to various patterns on the masks; and
    exposing the diamond to ion implantation through one mask at multiple selected energy levels to create a vertical void,
    wherein the void has a depth that is dependent on the energy levels of the multiple exposures, and
    wherein the void comprises a vertical via between channels at different levels of the diamond.

10. The method of claim 9 wherein the void comprises a vertical via between a reservoir in the diamond and the surface of the diamond.

11. The method of claim 9 wherein the diamond comprises a single crystalline CVD diamond.

12. The method of claim 9 wherein the ion implantation comprises hydrogen ions.

13. The method of claim 9 wherein the ion implantation comprises carbon ions.

14. The method of claim 9 wherein the ion implantations comprise both hydrogen ions and carbon ions during different exposures with different masks.

15. The method of claim 9 wherein processing the diamond comprises heating the diamond to a temperature sufficient to cause separation of the diamond about the implanted ions.

16. The method of claim 9 wherein processing the diamond comprises etching the diamond about the implanted ions.

* * * * *